United States Patent
Long et al.

(10) Patent No.: US 10,886,303 B2
(45) Date of Patent: Jan. 5, 2021

(54) ARRAY SUBSTRATE WITH STEPPED GROOVE AND DISPLAY DEVICE

(71) Applicant: BOE TECHNOLOGY GROUP CO., LTD., Beijing (CN)

(72) Inventors: Chunping Long, Beijing (CN); Pan Li, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/755,687

(22) PCT Filed: Jul. 28, 2017

(86) PCT No.: PCT/CN2017/094906
§ 371 (c)(1),
(2) Date: Feb. 27, 2018

(87) PCT Pub. No.: WO2018/126659
PCT Pub. Date: Jul. 12, 2018

(65) Prior Publication Data
US 2019/0027498 A1    Jan. 24, 2019

(30) Foreign Application Priority Data
Jan. 3, 2017 (CN) .................... 2017 2 0004109 U (51) Int. Cl.
*H01L 27/12* (2006.01)
*G02F 1/1343* (2006.01)
(Continued)

(52) U.S. Cl.
CPC .......... *H01L 27/124* (2013.01); *G02F 1/1368* (2013.01); *G02F 1/13394* (2013.01);
(Continued)

(58) Field of Classification Search
CPC ............... H01L 27/124; H01L 27/1248; G02F 1/1339–13394
See application file for complete search history.

(56) References Cited

U.S. PATENT DOCUMENTS 6,870,592 B1    3/2005    Yamamoto et al.
9,389,467 B2 *  7/2016    Jung ................... G02F 1/13394
(Continued)

FOREIGN PATENT DOCUMENTS

CN            1844992 A      10/2006
CN          102890368 A       1/2013
(Continued)

OTHER PUBLICATIONS

International search report dated Sep. 28, 2017 for corresponding application No. PCT/CN2017/094906 with English translation attached.
(Continued)

*Primary Examiner* — Stephen M Bradley
(74) *Attorney, Agent, or Firm* — Nath, Goldberg & Meyer; Joshua B. Goldberg (57) ABSTRACT

The application discloses an array substrate, comprising a base, a conductive pattern layer disposed on the base, a transparent electrode layer, and an insulating layer disposed between the conductive pattern layer and the transparent electrode layer, the conductive pattern layer comprises a plurality of first conductive patterns, the transparent electrode layer comprises a plurality of transparent electrodes, each of the transparent electrodes is electrically coupled to a corresponding one of the first conductive patterns through a corresponding via hole in the insulating layer, wherein at a position where at least one via hole is located, a stepped structure is formed between the first conductive pattern corresponding to the via hole and the base and/or the insulating layer such that a groove is formed at an upper surface of the array substrate at a position corresponding to
(Continued)

the via hole. The application further discloses a display device.

17 Claims, 3 Drawing Sheets

(51) Int. Cl.
    *G02F 1/1368*     (2006.01)
    *G02F 1/1339*     (2006.01)
    *G02F 1/1362*     (2006.01)
    *G02F 1/1333*     (2006.01)

(52) U.S. Cl.
    CPC .... *G02F 1/13439* (2013.01); *G02F 1/133345* (2013.01); *G02F 1/134309* (2013.01); *G02F 1/136227* (2013.01); *G02F 1/136286* (2013.01); *H01L 27/1248* (2013.01); *G02F 2001/13685* (2013.01); *G02F 2001/133357* (2013.01); *G02F 2001/134318* (2013.01)

(56) References Cited

U.S. PATENT DOCUMENTS

| | | | | |
|---|---|---|---|---|
| 9,448,448 | B2* | 9/2016 | Tomioka | G02F 1/133512 |
| 2004/0224241 | A1* | 11/2004 | Park | G02F 1/136227 |
| | | | | 430/5 |
| 2004/0233378 | A1* | 11/2004 | Okamoto | G02F 1/13394 |
| | | | | 349/156 |
| 2005/0110931 | A1* | 5/2005 | Yoo | G02F 1/134363 |
| | | | | 349/141 |
| 2007/0257279 | A1* | 11/2007 | Yamaguchi | G02F 1/136286 |
| | | | | 257/211 |
| 2008/0036959 | A1 | 2/2008 | Yang et al. | |
| 2014/0226100 | A1* | 8/2014 | Kim | G02F 1/134363 |
| | | | | 349/43 |
| 2015/0162355 | A1* | 6/2015 | Kim | H01L 27/1259 |
| | | | | 257/72 |
| 2016/0004114 | A1 | 1/2016 | Kuramoto | |
| 2016/0026033 | A1* | 1/2016 | Kang | G02F 1/133512 |
| | | | | 349/42 |
| 2016/0334680 | A1* | 11/2016 | Miyamoto | G02F 1/13394 |

FOREIGN PATENT DOCUMENTS

| | | |
|---|---|---|
| CN | 102981337 A | 3/2013 |
| CN | 105070684 A | 11/2015 |
| CN | 105974690 A | 9/2016 |
| JP | 201122535 A | 2/2011 |

OTHER PUBLICATIONS

Extended European Search Report dated Apr. 24, 2020 corresponding to application No. 17890424.9-1210.

* cited by examiner

ARRAY SUBSTRATE WITH STEPPED GROOVE AND DISPLAY DEVICE

CROSS-REFERENCE TO RELATED APPLICATIONS

This is a National Phase Application filed under 35 U.S.C. 371 as a national stage of PCT/CN2017/094906, filed Jul. 28, 2017, an application claiming the priority of Chinese Patent Application No. 201720004109.1, filed on Jan. 3, 2017, the contents of which are incorporated herein in their entirety by reference.

TECHNICAL FIELD

The present application relates to the field of display technology, and more particularly, to an array substrate and a display device comprising the array substrate.

BACKGROUND

A liquid crystal display panel comprises a color film substrate and an array substrate, and a liquid crystal layer composed of a liquid crystal material is arranged between the color film substrate and the array substrate. In order to achieve a stable thickness of the liquid crystal layer, a columnar spacer is also arranged between the two substrates. In the prior art, a plurality of columnar spacers are generally arranged on the color film substrate, these columnar spacers have a same height, and can achieve advantages such as eliminating light scattering produced by a septum and improving contrast, thus having an important impact on contrast, response time and view angle of the liquid crystal display.

SUMMARY

The present application provides an array substrate and a display device comprising the array substrate.

As a first aspect of the present application, there is provided an array substrate, comprising a base, a conductive pattern layer disposed on the base, a transparent electrode layer, and an insulating layer disposed between the conductive pattern layer and the transparent electrode layer, the conductive pattern layer comprises a plurality of first conductive patterns, the transparent electrode layer comprises a plurality of transparent electrodes, each of the transparent electrodes is electrically coupled to a corresponding one of the first conductive patterns via a corresponding via hole in the insulating layer, wherein at a position where at least one via hole is located, a stepped structure is formed between the first conductive pattern corresponding to the via hole and the substrate and/or the insulating layer such that a groove is formed at an upper surface of the array substrate at a position corresponding to the via hole.

Wherein the array substrate comprises a display region and a periphery region surrounding the display region, the first conductive pattern comprises a common electrode line, the transparent electrode layer comprises a common electrode layer, and the common electrode layer comprises a plurality of common electrodes located in the display region.

Wherein a portion of the common electrode line located in the display region comprises a plurality of electrode line parts and a plurality of connection parts, the electrode line parts and the connection parts are alternately disposed and coupled to each other, the connection part is located on the common electrode line at a position corresponding to the via hole, and the width of the connection part is not less than the width of the electrode line part.

Wherein the conductive pattern layer comprises a second conductive pattern comprising a gate and a gate line.

Wherein the common electrode line is parallel to the gate line.

Wherein the array substrate is configured in any one of the following manners:

the insulating layer is located between the conductive pattern layer and an active layer of the array substrate;

the array substrate comprises a gate insulating layer disposed between the conductive pattern layer and an active layer of the array substrate, a source/drain pattern layer disposed above the active layer and a passivation layer disposed on the source/drain pattern layer, the insulating layer comprises the gate insulating layer and the passivation layer, the common electrode layer is disposed on the passivation layer;

the array substrate comprises a gate insulating layer disposed between the conductive pattern layer and the active layer of the array substrate, a source/drain pattern layer disposed above the active layer and a planarization layer disposed on the source/drain pattern layer, the insulating layer comprises the gate insulating layer and the planarization layer, and the common electrode layer is disposed on the planarization layer;

the array substrate comprises a gate insulating layer disposed between the conductive pattern layer and an active layer of the array substrate, a source/drain pattern layer disposed above the active layer, a passivation layer disposed on the source/drain pattern layer, and a planarization layer disposed above the passivation layer, the insulating layer comprises the gate insulating layer, the passivation layer, and the planarization layer, and the common electrode layer is disposed on the planarization layer;

an active layer of the array substrate is disposed under the conductive pattern layer, the insulating layer is disposed above the conductive pattern layer, the array substrate further comprises the source/drain pattern layer disposed above the insulating layer, and the common electrode layer is disposed on the insulating layer;

an active layer of the array substrate is disposed under the conductive pattern layer, the array substrate further comprises an interlayer insulating layer disposed above the conductive pattern layer, a source/drain pattern layer disposed on the interlayer insulating layer, a passivation layer disposed on the source/drain pattern layer, the common electrode layer is disposed on the passivation layer, and the insulating layer comprises the passivation layer and the interlayer insulating layer;

an active layer of the array substrate is disposed under the conductive pattern layer, the array substrate further comprises an interlayer insulating layer disposed above the conductive pattern layer, a source/drain pattern layer disposed on the interlayer insulating layer, and a planarization layer disposed on the source/drain pattern layer, the common electrode layer is disposed on the planarization layer, and the insulating layer comprises the planarization layer and the interlayer insulating layer;

an active layer of the array substrate is disposed under the conductive pattern layer, the array substrate further comprises an interlayer insulating layer disposed above the conductive pattern layer, a source/drain pattern layer disposed on the source/drain pattern layer, a passivation layer disposed on the source/drain pattern layer and a planarization layer disposed on the passivation layer, the common electrode layer is disposed on the planarization layer, and the insulating layer comprises the interlayer insulating layer, the passivation layer, and the planarization layer.

Wherein the conductive pattern layer further comprises a third conductive pattern comprising a data line, a source and a drain.

Wherein the common electrode line is parallel to the data line.

Wherein the insulating layer is disposed above the conductive pattern layer, and the transparent electrode is disposed on the insulating layer.

Wherein the common electrode line has a width of 2 μm to 50 μm.

Wherein the common electrode line has a thickness of 50 nm~1000 nm.

Wherein the transparent electrode layer has a thickness of 10 nm to 500 nm.

Wherein the insulating layer has a thickness of 50 nm to 5 μm.

Wherein the via hole has a pore size of 1 μm to 50 μm.

Wherein the array substrate comprises a source/drain pattern layer insulated from the conductive pattern layer and/or a gate pattern layer insulated from the conductive pattern layer and the source/drain pattern layer.

As a second aspect of the present application, there is provided a display device comprising the above display panel and an opposite substrate aligned and assembled with the array substrate, the opposite substrate is provided with a plurality of columnar spacers thereon, at least one of the columnar spacers is provide to correspond to the groove of the array substrate, and one end of the columnar spacer facing the array substrate is inserted into a corresponding groove.

Wherein the one end of the columnar spacer facing the array substrate has a shape matching that of the groove.

BRIEF DESCRIPTION OF THE DRAWINGS

Accompanying drawings are provided for further understanding of this application and constitute a part of the specification. Hereinafter, these drawings are intended to explain the application together with the following specific embodiments, but should not be considered as a limitation of the application, in which:

FIG. 3 is obtained by taking a cross section along a line aa' in FIG. 5;

FIG. 7 is obtained by taking a cross section along a line aa' in FIG. 5;

wherein 10. base; 100. display region; 11. common electrode line; 110. data line; 111. electrode line part; 112. connection part; 12. insulating layer; 121. passivation layer; 122. gate insulating layer; 13. common electrode layer; 14. groove; 15. gate; 16. active layer; 17. source; 18. drain; 19. planarization layer; 20. columnar spacer; 200. periphery region; 300. opposite substrate.

DETAILED DESCRIPTION

Hereinafter, specific embodiments of the application will be described in detail in conjunction with the accompanying drawings. It should be understood that the specific embodiments as set forth herein are merely for the purpose of illustration and explanation of the application and should not be constructed as a limitation thereof.

It should be noted that the terms "upper", "lower" and the like described in the present application refer to the directions shown in the drawings.

All color filter layers on the color filter substrate are formed by curing liquid photoresist, and due to fluidity of the liquid photoresist and height difference between a black matrix at a center and the black matrix at both sides, a surface of a base for supporting the columnar spacers on the color filter substrate is not flat (especially in the direction of a narrow black matrix). For a proximity exposure machine, parallelism of light has a great influence on uniformity of exposure patterns. When columnar spacers are formed, the top morphology is not uniform and has inconsistent dimensions in various directions, thereby affecting the support effect of columnar spacers when the two substrates are aligned and assembled to form a cell. Uneven force in the various directions will also affect the display effect and reduce the display quality. With increase of resolution, the demand of narrowing the black matrix will become bigger, it is more difficult to obtain the flatness, and thus the problem of columnar spacer deformation becomes more and more prominent.

In addition, since the columnar spacers provide support for the color filter substrate and the array substrate only in the vertical direction of the liquid crystal display panel, and has no bonding function, when the liquid crystal display panel is used vertically, the columnar spacers are also subjected to force in the horizontal or vertical direction under influence of their own gravity or external impact, the array substrate and the color filter substrate may be misaligned or slide, the resulting alignment inaccuracy causes misalignment between the black matrix and a thin film transistor to cause light leakage or uneven cell thickness, and affects the display quality of a liquid crystal display.

As a first aspect of the present application, there is provided an array substrate, comprising a base, a conductive pattern layer disposed on the base, a transparent electrode layer, and an insulating layer disposed between the conductive pattern layer and the transparent electrode layer, the conductive pattern layer comprises a plurality of first conductive patterns, the transparent electrode layer comprises a plurality of transparent electrodes, each of the transparent electrodes is electrically coupled to a corresponding one of the first conductive patterns via a corresponding via hole in the insulating layer, wherein at a position where at least one via hole is located, a stepped structure is formed between the first conductive pattern corresponding to the via hole and the base such that a groove is formed on an upper surface of the array substrate at a position corresponding to the via hole.

In the array substrate provided by the present application, a groove is formed by at least one conductive pattern in the conductive pattern layer and a via hole corresponding to the transparent electrode, when assembling the array substrate having the via hole and an opposite substrate to form a cell, the columnar spacer on the opposite substrate can be inserted into the groove, to prevent sliding of the column spacer and misalignment between the array substrate and the opposite substrate, meanwhile, insertion of the columnar spacer into the groove can also improve the uniformity of the cell thickness after the array substrate and the opposite substrate are assembled.

Specifically, the conductive pattern layer may be configured in many manners, for example, the conductive pattern layer is a source/drain layer, and the conductive pattern is a source/drain, the transparent electrode is a pixel electrode, the via hole is a via hole electrically coupling the pixel electrode to the drain; if the conductive pattern layer is a common electrode line layer, the conductive pattern is a common electrode line, the transparent electrode is a common electrode, and the via hole is a via hole electrically coupling the common electrode to the common electrode line.

Figure 1:
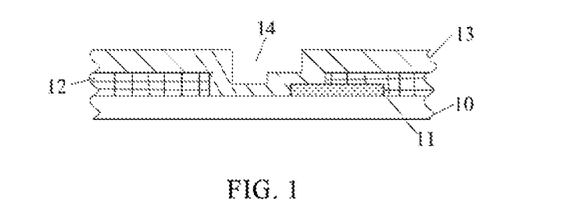
FIG. 1 is a schematic diagram of a structure of an array substrate provided by the present application.

As a specific embodiment of the present application, the array substrate comprises a display region and a periphery region surrounding the display region, the first conductive pattern comprises a common electrode line, the transparent electrode layer comprises a common electrode layer, and the common electrode layer comprises a plurality of common electrodes located in the display region, Specifically, as shown in FIG. 1, taking the first conductive pattern as the common electrode line as an example, at this time, since the conductive pattern layer comprises a plurality of first conductive patterns, the conductive pattern layer comprises a plurality of common electrode lines, the transparent electrode layer comprises a common electrode layer, the array substrate comprises a base 10, a conductive pattern layer disposed on the base 10, a common electrode layer 13, and an insulating layer 12 disposed between the conductive pattern layer and the common electrode layer 13. The conductive pattern layer comprises a plurality of common electrode lines 11. The common electrode layer 13 comprises a plurality of common electrodes. Each of the common electrodes is electrically coupled to a corresponding common electrode line 11 through a corresponding via hole, wherein at a position where at least one via hole is located, a stepped structure is formed either between the common electrode line 11 corresponding to the via hole and the base 10, or between the common electrode line 11 corresponding to the via hole and the insulating layer 12 such that a groove 14 is formed on the upper surface of the array substrate at a position corresponding to the via hole.

It should be noted that the common electrodes electrically coupled to the common electrode line 11 through the via holes are all common electrodes located in the display region of the array substrate.

In view of the problem in the prior art that the surface of the base for supporting the columnar spacers on the opposite substrate is not flat such that the surface of the assembled display panel is subjected to uneven force and the display effect is affected, the inventor has found that, without changing the existing columnar spacers and the structure of the opposite substrate, a groove is formed on the array substrate at a position corresponding to the columnar spacer, when assembling the array substrate and the opposite substrate, at least one columnar spacer is located in the groove, which not only prevents sliding and misalignment between the opposite substrate and the array substrate after being assembled, but also alleviates the problem of irregularity of the base for columnar spacers, and thus an effective support can be obtained.

In the array substrate provided by the present application, a stepped structure is formed between the common electrode line and the base at a position where at least one via hole is located so that a groove is formed on the upper surface of the array substrate at a position corresponding to the via hole. When assembling the array substrate having the via hole and the opposite substrate having columnar spacers, inserting the columnar spacer into the groove can prevent sliding of the column spacer and misalignment between the array substrate and the opposite substrate, meanwhile, insertion of the columnar spacer into the groove can also improve the uniform cell thickness after the array substrate and the opposite substrate are assembled. In addition, the stepped structure formed between the common electrode line and the base facilitates accommodating deformation of columnar spacers, and the stepped structure can also effectively alleviate irregularity of the base for the columnar spacers due to fluidity of the liquid photoresistor after the liquid photoresist on the opposite substrate is cured, avoid deformation and light leakage of the display panel caused by uneven columnar spacers, and avoid damage to the surface of the array substrate due to the deviation of the supporting force direction after the columnar spacers are deformed.

Specifically, the conductive pattern comprises a plurality of common electrode lines 11, the insulating layer 12 covers the common electrode lines 11, the common electrode layer 13 is disposed above the insulating layer 12, there are a plurality of via holes penetrating the insulating layer 12, and at least one common electrode of the common electrode layer 13 corresponds to the via hole. It should be understood that, the via hole penetrates through the insulation layer 12 to expose a portion of the common electrode line 11 corresponding to the via hole, and since the common electrode line 11 is located on the base 10, and part of the base 10 adjacent to the common electrode line 11 can also be exposed when the via hole is formed. In this way, since the common electrode line 11 and the base 10 are not in the same layer, a stepped structure is formed inside the via hole, that is, a groove 14 is formed on an upper surface of the array substrate at a position corresponding to the via hole such that the columnar spacer located on the opposite substrate can be inserted into the groove 14 when assembling the array substrate and the opposite substrate to form a cell, and misalignment or sliding will not occur between the array substrate and the opposite substrate after being assembled.

It should be understood that, a dimension of the opening of the groove 14 is slightly larger than that of one end of the columnar spacer facing the groove 14 so that the columnar spacer can be inserted into the groove 14.

It should also be understood that, at least one via hole is formed to expose at least a portion of the common electrode line 11 corresponding to the via hole and a portion of the base 10 adjacent to the common electrode line 11. When a base for one columnar spacer among the plurality of column spacers on the opposite substrate to be aligned with the array substrate is not flat, a groove 14 corresponding to the columnar spacer is formed on the array substrate, the columnar spacer is inserted into the groove 14, and the assembling will not be affected even if the base for the columnar spacer is not flat. In addition, the insertion of the columnar spacer into the groove 14 can avoid sliding between the opposite substrate and the array substrate. Of course, a plurality of the above via holes may also be formed on the array substrate to form a plurality of grooves 14, the column spacers are inserted into the grooves 14 respectively to prevent the misalignment between the opposite substrate and the array substrate while obtaining an effective support.

It should be noted that, the base 10 may be a transparent substrate having a patterned structure formed thereon, or may be a transparent substrate without a pattern.

Figure 2:
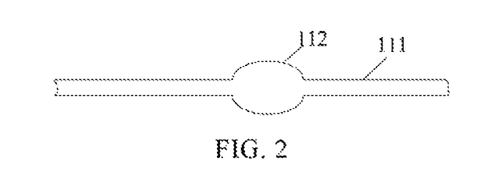
FIG. 2 is a schematic diagram of a structure of a common electrode line 11 provided by the present application comprising an electrode line part 111 connected to a connection part 112.

In order to ensure the yield of the via hole, as a specific embodiment, as shown in FIG. 2, wherein a portion of the common electrode line 11 located in the display region comprises a plurality of electrode line parts 111 and a plurality of connection parts 112, the electrode line parts 111 and the connection parts 112 are alternately disposed and coupled to each other, the connection part 112 is located on the common electrode line 11 at a position corresponding to the via hole, and the width of the connection part 112 is not less than the width of the electrode line part 111, It should be understood that, from the above, the plurality of common electrodes in the display region of the array substrate are electrically coupled to the common electrode lines 11 through the via holes, respectively. Therefore, in order to ensure the yield of the via hole, a portion of the common electrode line 11 located in the display region comprises a plurality of electrode line parts 111 and a plurality of connection parts 112, the common electrode line 11 is provided as the connection part 112 at a position corresponding to the via hole, and with the width of the connecting part 112 set to be greater than the width of the electrode line part 111, the contact area between the common electrode line 11 and the via hole can be increased to ensure the yield of the via hole. In general, the common electrode line has a width of 2 μm to 50 μm, that is, both the electrode line part 111 and the connection part 112 have widths within the range. For example, the width of the connecting part 112 is twice the width of the electrode line part 111.

In addition, the common electrode line 11 may be a single metal film or an alloy metal film, comprising one or more metal materials of molybdenum, tungsten, titanium, chromium, aluminum, copper, nickel, neodymium, niobium and the like, such as molybdenum niobium alloy, aluminum neodymium alloy, etc., and may also be a multilayer metal film, such as a multi-layer metal film of molybdenum/aluminum/molybdenum, titanium/aluminum/titanium, and so on.

As a specific embodiment of the conductive pattern layer, the conductive pattern layer comprises a second conductive pattern comprising a gate and a gate line.

Here, it should be understood that, when the conductive pattern layer comprises the first conductive pattern and the second conductive pattern, since the first conductive pattern comprises the common electrode line and the second conductive pattern comprises the gate and the gate line, the common electrode line 11 is disposed in a same layer as the gate and the gate line. The common electrode line 11 has a same thickness as the gate pattern, for example, the common electrode line 11 has a thickness of 50 nm to 1000 nm.

The common electrode line 11 and the gate line may be disposed in parallel.

When the conductive pattern layer comprises the second conductive pattern, the array substrate is configured in any one of the following manners:

(1) the insulating layer 12 is located between the conductive pattern layer and an active layer of the array substrate.

It should be understood that, in this embodiment, the conductive pattern layer and the layer where the common electrode line 11 is located are the same layer. In this case, the insulating layer 12 is a gate insulating layer of the array substrate, and the common electrode layer 13 is provided on the gate insulating layer. From the above, it can be seen that the insulating layer 12 is located above the conductive pattern layer and the active layer is disposed above the conductive pattern layer. Therefore, it can be seen that the array substrate is of a bottom-gate structure. In this case, the via hole penetrates through the insulating layer 12.

(2) the array substrate comprises a gate insulating layer disposed between the conductive pattern layer and an active layer of the array substrate, a source/drain pattern layer disposed above the active layer and a passivation layer disposed on the source/drain pattern layer, the insulating layer 12 comprises the gate insulating layer and the passivation layer, and the common electrode layer 13 is disposed on the passivation layer.

It should be understood that, when the array substrate is of a bottom-gate structure, the array substrate is configured as described above. In this case, the insulating layer 12 may be the gate insulating layer and the passivation layer. In this case, the via hole penetrates through the gate insulating layer and the passivation layer. As described above, the common electrode layer 13 is disposed above the insulating layer 12. Therefore, the common electrode layer 13 with this structure is disposed on the passivation layer.

(3) the array substrate comprises a gate insulating layer disposed between the conductive pattern layer and an active layer of the array substrate, a source/drain pattern layer disposed above the active layer and a planarization layer disposed on the source/drain pattern layer, the insulating layer 12 comprises the gate insulating layer and the planarization layer, and the common electrode layer is disposed on the planarization layer.

Specifically, when the array substrate is of a bottom-gate structure, the insulating layer 12 may comprise the gate insulating layer and the planarization layer. In this case, the via hole penetrates through the gate insulating layer and the planarization layer. Accordingly, the common electrode layer 13 is disposed on the planarization layer.

(4) the array substrate comprises a gate insulating layer disposed between the conductive pattern layer and an active layer of the array substrate, a source/drain pattern layer disposed above the active layer and a passivation layer disposed on the source/drain pattern layer, a planarization layer disposed above the passivation layer, the insulating layer 12 comprises the gate insulating layer, the passivation layer, and the planarization layer, and the common electrode layer 13 is disposed on the planarization layer.

(5) an active layer of the array substrate is disposed under the conductive pattern layer, the insulating layer 12 is disposed above the conductive pattern layer, the array substrate further comprises a source/drain pattern layer disposed above the insulating layer 12, and the common electrode layer 13 is disposed on the insulating layer 12.

Specifically, in the array substrate, the active layer is disposed under the conductive pattern layer, and the array substrate is of a top-gate structure. As described above, the insulating layer 12 is located between the conductive pattern layer and the common electrode layer 13. The via hole penetrates through the insulating layer 12. Therefore, the common electrode layer 13 is located on the insulating layer 12.

(6) an active layer of the array substrate is disposed under the conductive pattern layer, the array substrate further comprises an interlayer insulating layer disposed above the conductive pattern layer, a source/drain pattern layer disposed on the interlayer insulating layer, a passivation layer disposed on the source/drain pattern layer, the common electrode layer 13 is disposed on the passivation layer, and the insulating layer 12 comprises the passivation layer and the interlayer insulating layer;

Specifically, when the array substrate is of a top-gate structure, the insulating layer 12 of the array substrate may be the passivation layer and the interlayer insulating layer described above. In this case, the via hole penetrates through the passivation layer and the interlayer insulating layer.

(7) an active layer of the array substrate is disposed under the conductive pattern layer, the array substrate further comprises an interlayer insulating layer disposed above the conductive pattern layer, a source/drain pattern layer disposed on the interlayer insulating layer, and a planarization layer disposed on the source/drain pattern layer, the common electrode layer 13 is disposed on the planarization layer, and the insulating layer 12 comprises the planarization layer and the interlayer insulating layer;

Specifically, when the array substrate is of a top-gate structure, the insulating layer 12 of the array substrate may be the passivation layer and the interlayer insulating layer described above. In this case, the via hole penetrates through the planarization layer and the interlayer insulating layer.

(8) an active layer of the array substrate is disposed under the conductive pattern layer, the array substrate further comprises an interlayer insulating layer disposed above the conductive pattern layer, a source/drain pattern layer disposed on the interlayer insulating layer, a passivation layer disposed on the source/drain pattern layer and a planarization layer disposed on the passivation layer, the common electrode layer 13 is disposed on the planarization layer, and the insulating layer 12 comprises the interlayer insulating layer, the passivation layer, and the planarization layer.

As another embodiment of the conductive pattern, the conductive pattern layer further comprises a third conductive pattern comprising a data line, a source and a drain.

Specifically, when the conductive pattern layer comprises the first conductive pattern and the third conductive pattern, since the first conductive pattern comprises a common electrode line 11, the third conductive pattern comprises a data line, a source and a drain, the common electrode line 11 and the third conductive pattern are disposed in the same layer, that is, the common electrode line 11 is disposed in the same layer as the data line and the source and the drain.

It should be understood that, the third conductive pattern comprises a plurality of data lines, a plurality of sources and a plurality of drains. Specifically, the common electrode line 11 is disposed in the same layer as the third conductive pattern, the common electrode line 11 and the data line have the same thickness, material and composition, and the thickness of the common electrode line 11 is 50 nm to 1000 nm as described above.

For example, the common electrode line 11 is parallel to the data line.

Specifically, the conductive pattern layer, the insulating layer and the transparent electrode layer are configured such that the insulating layer is disposed above the conductive pattern layer, and the transparent electrode is disposed on the insulating layer.

Taking FIG. 1 as an example, the insulating layer 12 is disposed above the conductive pattern layer, and the common electrode is disposed on the insulating layer 12.

When the common electrode line 11 and the third conductive pattern are disposed in the same layer, for example, the array substrate at this time may comprise an active layer disposed below the conductive pattern layer, an interlayer insulating layer is provided above the conductive pattern layer, a gate pattern is disposed above the interlayer insulating layer, a passivation layer is disposed above the gate pattern, and the common electrode is disposed on the passivation layer, in this case, the insulating layer 12 comprises the interlayer insulating layer and the passivation layer, and the via hole penetrates through the interlayer insulating layer and the passivation layer. It should be understood that, the passivation layer may further be a planarization layer, that is, the planarization layer is disposed above the gate pattern, in this case, the insulating layer 12 comprises the interlayer insulating layer and the planarization layer, and the via hole penetrates through the interlayer insulating layer and the planarization layer.

A person skilled in the art can readily understand that, the structure of the array substrate herein may be substantially the same as that of the array substrate in which the conductive pattern comprises the gate pattern described above, except that the insulating layer 12 is slightly different because the common electrode line 11 and the third conductive pattern are disposed in the same layer. For example, when the array substrate in this embodiment is of the structure as stated in (2), the insulating layer 12 comprises the passivation layer; when the array substrate in this embodiment is of the structure as stated in (3), the insulating layer 12 comprises the planarization layer, and so on.

It should be noted that, the transparent electrode layer has a thickness of 10 nm to 500 nm. Taking FIG. 1 as an example, the transparent electrode layer described above has a thickness of 10 nm to 500 nm. The common electrode layer 13 is made of a transparent conductive film, and the transparent conductive film has a thickness of 10 nm to 500 nm. A material of the common electrode layer 13 can be one or more of indium tin oxide, indium zinc oxide, indium oxide, tin oxide, zinc oxide, cadmium oxide, indium cadmium oxide, tin cadmium oxide, zinc tin oxide, and the like.

The insulating layer 12 described above has a thickness of 50 nm to 5 μm. A material of the insulating layer 12 may be one of oxides such as silicon nitride, silicon oxide, silicon oxynitride, aluminum oxide and vanadium oxide or a combination thereof, and may comprise an organic film such as acrylic or polyimide, or may be a combination of the inorganic oxide and the organic film.

As a specific embodiment of the groove, as described above, the groove 14 has a step-shaped bottom.

For a better cushioning effect, for example, the groove 14 comprises at least one step. When the groove 14 comprises a plurality of steps, uniform step heights may be set for the plurality of steps.

When the array substrate and the opposite substrate are assembled, the groove provided with a plurality of steps can play a role of cushioning when the columnar spacer located on the opposite substrate is inserted into the groove 14, and the plurality of steps can impose a strong support for the columnar spacer when the column spacer is inserted into the groove such that the columnar spacer can provide a stable support for the array substrate and the opposite substrate.

It should be understood that, in order to make the columnar spacer on the opposite substrate better match the groove on the array substrate and make the columnar spacer play a better supporting role, one end of the columnar spacer facing the groove may be configured to have a stepped shape matching the step in the groove, in this way, when one end of the columnar spacer, which also has a stepped shape, is inserted into the groove, it can match with the step in the groove to provide a more stable support.

As a specific embodiment of the via hole, the via hole has an aperture of 1 μm to 50 μm.

As another embodiment of the conductive pattern layer, the array substrate comprises a source/drain pattern layer insulated from the conductive pattern layer and/or a gate pattern layer insulated from the conductive pattern layer and the source/drain pattern layer.

It should be understood that, in this embodiment, since the conductive pattern layer is insulated from the source/drain pattern layer, and the gate pattern layer is insulated from both the source/drain pattern layer and the conductive pattern layer, the insulating layer 12 may have various cases: for example, the insulating layer 12 may comprise a gate insulating layer, or a gate insulating layer and a passivation layer, or a gate insulating layer and a planarization layer, or an interlayer insulating layer, or an interlayer insulating layer and a passivation layer, or an interlayer insulating layer and a planarization layer. In addition, the insulating layer 12 may comprise a gate insulating layer and an interlayer insulating layer, or a gate insulating layer, an interlayer insulating layer, and a passivation layer, or a gate insulating layer, an interlayer insulating layer, and a planarization layer, or a passivation layer, or a gate insulating layer, an interlayer insulating layer, a passivation layer and a planarization layer.

As a second aspect of the present application, there is provided a display device comprising a display panel, wherein the display panel comprises the above array substrate and an opposite substrate aligned and assembled with the array substrate, the opposite substrate is provided with a plurality of columnar spacers, at least one of the columnar spacers corresponds to the groove of the array substrate, and one end of the columnar spacer facing the array substrate is inserted into a corresponding groove.

For example, one end of the columnar spacer facing the array substrate has a shape matching the shape of the groove. Specifically, when the lower surface of the groove as shown in FIG. 3 is of a stepped structure, an end of the columnar spacer facing the array substrate may also be formed to have a stepped structure that matches the step structure of the groove.

Figure 3:
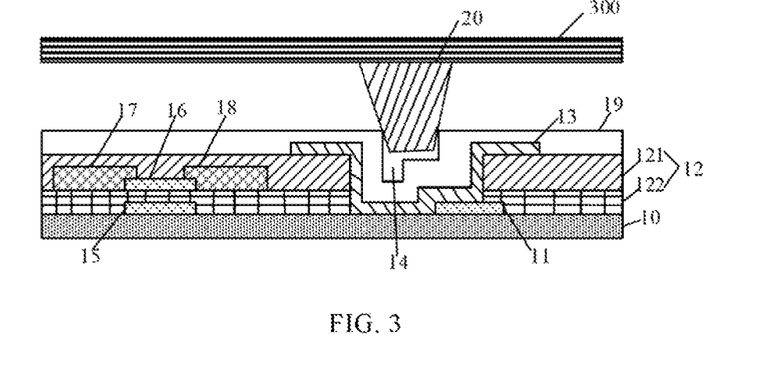
FIG. 3 is a schematic diagram illustrating inserting a columnar spacer 20 on an opposite substrate 300 into a goose 14 of the array substrate.
Figure 4:
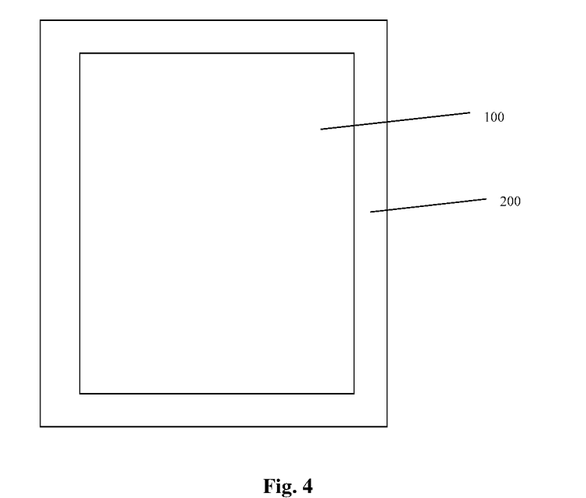
FIG. 4 is a schematic diagram illustrating an array substrate including a display region 100 and a periphery region 200 according to an embodiment of the present disclosure.
Figure 5:
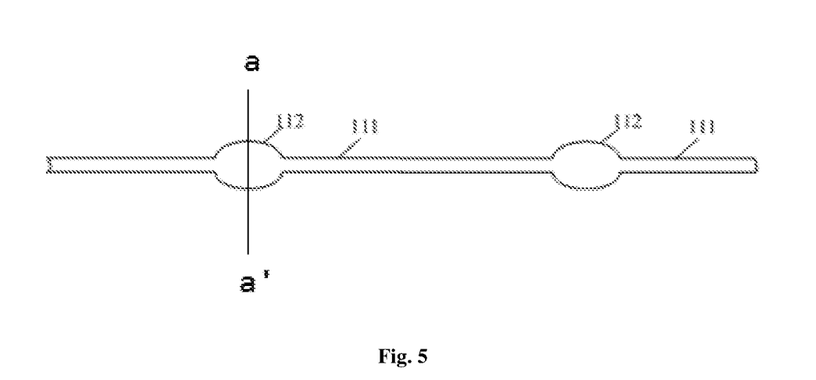
FIG. 5 is a schematic diagram illustrating a portion of the common electrode line 11 located in the display region 100 according to the present subject matter, wherein the portion of the common electrode line 11 consists of a plurality of electrode line parts 111 and a plurality of connection parts 112.
Figure 6:
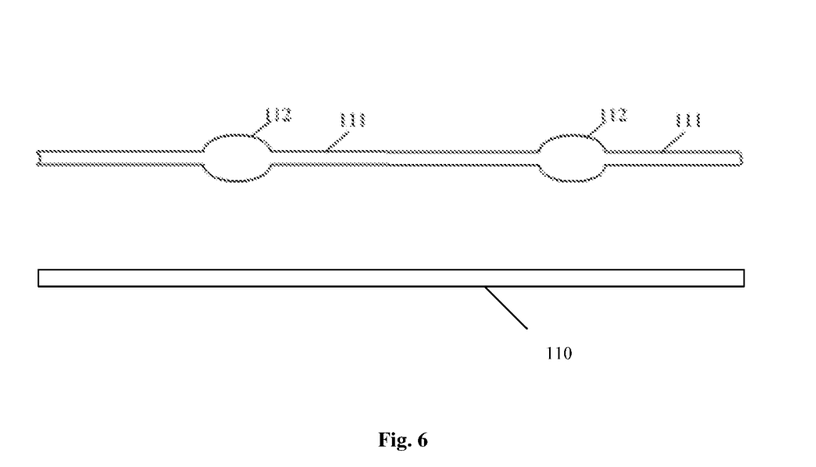
FIG. 6 is a schematic diagram illustrating an embodiment in which a common electrode line 11 is parallel to the a data line 110.
Figure 7:
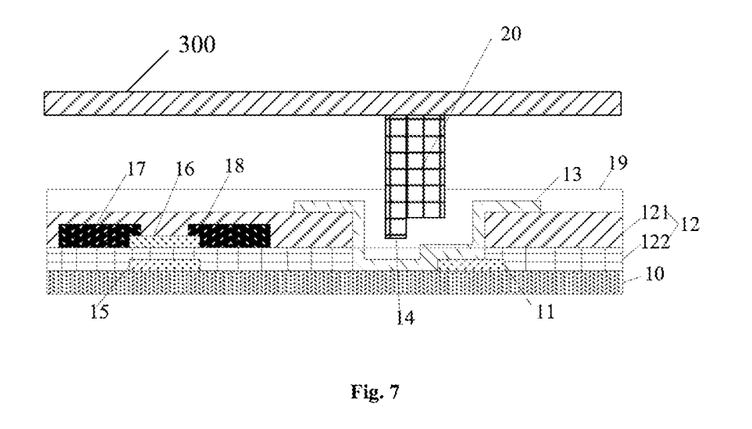
FIG. 7 is a schematic diagram illustrating an embodiment in which of a display device according to an embodiment of the present disclosure in which one end of the columnar spacer 20 on an opposite substrate 300 facing an array substrate has a shape matching that of the groove.

FIG. 3 is a schematic diagram illustrating inserting the columnar spacers 20 into the groove of the array substrate. Taking the array substrate with the structure stated in (2) above as an example, wherein the array substrate is of a bottom-gate structure, and comprises a gate electrode 15 disposed on a base 10, the common electrode line 11 is disposed in the same layer as the gate electrode 15, the insulating layer 12 comprises a gate insulating layer 122 and a passivation layer 121, the gate insulating layer 122 covers the layer where the gate electrode 15 and the common electrode line 11 are located, an active layer 16 is located on the gate insulating layer 122, a source 17 and a drain 18 are located above the active layer 16, the passivation layer 121 covers the layer where the source 17 and the drain 18 are located, the common electrode layer 13 is located on the passivation layer 121, a planarization layer 19 is disposed above the common electrode layer 13, the groove 14 formed at a position corresponding to the via hole penetrating through the gate insulating layer 122 and the passivation layer 121 is as shown in FIG. 3, a columnar spacer 20 on the opposite substrate is inserted into the groove 14 on the array substrate, and after the opposite substrate and the array substrate are assembled, even if the liquid crystal panel is used vertically, no misalignment or sliding will occur between the array substrate and the opposite substrate. In order to cause the columnar spacer 20 to fit the groove 14 more stably, for example, one end of the columnar spacer facing the array substrate has a shape matching the shape of the groove 14. Specifically, when the groove 14 has a stepped shape, the columnar spacer 20 also has a matching stepped shape at its front end.

Therefore, there is no problem of light leakage or uneven thickness of the display panel after being assembled in this way, and the displayed picture has a high quality.

A stepped structure is formed in the groove 14 shown in FIG. 1 and FIG. 3. In this case, at the position where at least one via hole is located, a stepped structure is formed either between the first conductive pattern and the base, or between the first conductive pattern and the insulating layer. In fact, the present application can be realized only by forming a stepped structure between the first conductive pattern and the base or forming a stepped structure between the first conductive pattern and the insulating layer, and the bottom of the groove formed at this time will not be stepped, but flat. In this case, when the array substrate and the opposite substrate are assembled, the spacer will dig deep into the groove, similar to the embodiments shown in FIG. 1 and FIG. 3, the array substrate and the opposite substrate are also made more stable after being assembled, there is no problem of light leakage or unevenness and the displayed picture has a high quality.

Therefore, the display device provided by the present application overcomes the problem that the columnar spacer affects the support due to its deformation in the display panel and the misaligned movement between the array substrate and the opposite substrate, can prevent the columnar spacer from being displaced or damaged when the display panel is affected by its own gravity or external impact, solves the problem of inaccurate alignment and unevenness in the cell thickness, thereby providing a better picture quality for the display device.

Specifically, the display device may be any product or component having a display function such as a cell phone, a tablet computer, a television, a display, a notebook computer, a navigator and the like.

It will be appreciated that the above embodiments are exemplary implementations for the purpose of illustrating the principle of the present application only, and the present application is not limited thereto. It will be apparent to a person skilled in the art that many variations and modifications may be made without departing from the spirit and essence of the present application. These variations and modifications should also be considered as the protective scope of the present application.

What is claimed is:

1. A display device comprising a display panel, wherein the display panel comprises an array substrate and an opposite substrate aligned and assembled with the array substrate, the opposite substrate is provided with a plurality of columnar spacers thereon, the array substrate comprises a base, a conductive pattern layer disposed on the base, a transparent electrode layer, and an insulating layer disposed between the conductive pattern layer and the transparent electrode layer, the conductive pattern layer comprises a plurality of first conductive patterns, the transparent electrode layer comprises a plurality of transparent electrodes, each of the transparent electrodes is electrically coupled to a corresponding one of the first conductive patterns through a corresponding via hole in the insulating layer, and at a position where at least one via hole is located, a stepped structure is formed between the first conductive pattern corresponding to the via hole and the base and/or the insulating layer such that a stepped groove is formed at an upper surface of the array substrate at a position corresponding to the via hole, the upper surface of the array substrate is provided with a first planarization layer such that the stepped groove is formed at an upper surface of the first planarization layer at a position corresponding to the via hole, at least one of the columnar spacers is provide to correspond to the stepped groove of the array substrate, and one end of the columnar spacer facing the array substrate is inserted into a corresponding stepped groove, the one end of the columnar spacer facing the array substrate has a stepped shape matching that of the stepped groove, and the stepped groove provided at the upper surface of the first planarization layer surrounds the one end of the columnar spacer facing the array substrate of the stepped shape.

2. The display device according to claim 1, wherein the array substrate comprises a display region and a periphery region surrounding the display region, the first conductive pattern comprises a common electrode line, the transparent electrode layer comprises a common electrode layer, and the common electrode layer comprises a plurality of common electrodes located in the display region.

3. The display device according to claim 2, wherein a portion of the common electrode line located in the display region comprises a plurality of electrode line parts and a plurality of connection parts, the electrode line parts and the connection parts are alternately disposed and coupled to each other, the connection part is located on the common electrode line at a position corresponding to the via hole, and the width of the connection part is not less than the width of the electrode line part.

4. The display device according to claim 2, wherein the conductive pattern layer comprises a second conductive pattern comprising a gate and a gate line.

5. The display device according to claim 4, wherein the common electrode line is parallel to the gate line.

6. The display device according to claim 4, wherein the array substrate is configured in any one of the following manners:

the insulating layer is located between the conductive pattern layer and an active layer of the array substrate;

the array substrate comprises a gate insulating layer disposed between the conductive pattern layer and an active layer of the array substrate, a source/drain pattern layer disposed above the active layer and a passivation layer disposed on the source/drain pattern layer, the insulating layer comprises the gate insulating layer and the passivation layer, and the common electrode layer is disposed on the passivation layer;

the array substrate comprises a gate insulating layer disposed between the conductive pattern layer and the active layer of the array substrate, a source/drain pattern layer disposed above the active layer and a second planarization layer disposed on the source/drain pattern layer, the insulating layer comprises the gate insulating layer and the second planarization layer, and the common electrode layer is disposed on the second planarization layer;

the array substrate comprises a gate insulating layer disposed between the conductive pattern layer and an active layer of the array substrate, a source/drain pattern layer disposed above the active layer, a passivation layer disposed on the source/drain pattern layer, and a second planarization layer disposed above the passivation layer, the insulating layer comprises the gate insulating layer, the passivation layer, and the second planarization layer, and the common electrode layer is disposed on the second planarization layer;

an active layer of the array substrate is disposed under the conductive pattern layer, the insulating layer is disposed above the conductive pattern layer, the array substrate further comprises a source/drain pattern layer disposed above the insulating layer, and the common electrode layer is disposed on the insulating layer;

an active layer of the array substrate is disposed under the conductive pattern layer, the array substrate further comprises an interlayer insulating layer disposed above the conductive pattern layer, a source/drain pattern layer disposed on the interlayer insulating layer, a passivation layer disposed on the source/drain pattern layer, the common electrode layer is disposed on the passivation layer, and the insulating layer comprises the passivation layer and the interlayer insulating layer;

an active layer of the array substrate is disposed under the conductive pattern layer, the array substrate further comprises an interlayer insulating layer disposed above the conductive pattern layer, a source/drain pattern layer disposed on the interlayer insulating layer, and a second planarization layer disposed on the source/drain pattern layer, the common electrode layer is disposed on the second planarization layer, and the insulating layer comprises the second planarization layer and the interlayer insulating layer;

an active layer of the array substrate is disposed under the conductive pattern layer, the array substrate further comprises an interlayer insulating layer disposed above the conductive pattern layer, a source/drain pattern layer disposed on the interlayer insulating layer, a passivation layer disposed on the source/drain pattern layer and a second planarization layer disposed on the passivation layer, the common electrode layer is disposed on the second planarization layer, and the insulating layer comprises the interlayer insulating layer, the passivation layer, and the second planarization layer.

7. The display device according to claim 2, wherein the conductive pattern layer further comprises a third conductive pattern comprising a data line, a source and a drain.

8. The display device according to claim 7, wherein the common electrode line is parallel to the data line.

9. The display device according to claim 1, wherein the insulating layer is disposed above the conductive pattern layer, and the transparent electrode is disposed on the insulating layer.

10. The display device according to claim 2, wherein the common electrode line has a width of 2 μm to 50 μm.

11. The display device according to claim 2, wherein the common electrode line has a thickness of 50 nm~1000 nm.

12. The display device according to claim 1, wherein the transparent electrode layer has a thickness of 10 nm to 500 nm.

13. The display device according to claim 1, wherein the insulating layer has a thickness of 50 nm to 5 μm.

14. The display device according to claim 1, wherein the via hole has an aperture of 1 μm to 50 μm.

15. The display device according to claim 1, wherein the array substrate comprises a source/drain pattern layer insulated from the conductive pattern layer, and/or a gate pattern layer insulated from the conductive pattern layer and the source/drain pattern layer.

16. The display device according to claim 2, wherein the array substrate comprises a source/drain pattern layer insulated from the conductive pattern layer, and/or a gate pattern layer insulated from the conductive pattern layer and the source/drain pattern layer.

17. The display device according to claim 3, wherein the array substrate comprises a source/drain pattern layer insulated from the conductive pattern layer, and/or a gate pattern layer insulated from the conductive pattern layer and the source/drain pattern layer.

\* \* \* \* \*